United States Patent [19]

Presser

[11] 4,338,582
[45] Jul. 6, 1982

[54] ELECTRONICALLY TUNABLE RESONATOR CIRCUIT

[75] Inventor: Adolph Presser, Kendall Park, N.J.

[73] Assignee: RCA Corporation, New York, N.Y.

[21] Appl. No.: 70,022

[22] Filed: Aug. 27, 1979

Related U.S. Application Data

[63] Continuation-in-part of Ser. No. 947,055, Sep. 29, 1978, abandoned.

[51] Int. Cl.³ ............... H03H 11/08; H03H 11/10; H01P 1/38; H03F 3/193
[52] U.S. Cl. ................... 333/175; 330/61 A; 333/1.1; 333/185; 333/215; 333/217
[58] Field of Search ............... 333/1.1, 213, 214, 217, 333/175–176; 334/15; 307/57; 330/56, 61 A, 287; 357/42

[56] References Cited

U.S. PATENT DOCUMENTS

| | | | |
|---|---|---|---|
| 3,079,571 | 2/1963 | Elliot et al. | 333/174 |
| 3,110,004 | 11/1963 | Pope | 334/15 |
| 3,737,801 | 6/1963 | Adams et al. | 333/217 X |
| 4,025,872 | 5/1977 | Grayzel | 330/287 |
| 4,064,525 | 12/1977 | Kano et al. | 357/42 |

FOREIGN PATENT DOCUMENTS 1323712  7/1973 United Kingdom ............... 333/217

OTHER PUBLICATIONS

Bains et al.—"Analysis and Design of an X-Band Actively Compensated Impatt Diode Amplifier", IEEE Trans. On Microwave Theory and Techniques, Jan. 1979, pp. 17–23.

*Primary Examiner*—Marvin L. Nussbaum
*Attorney, Agent, or Firm*—Samuel Cohen; Robert L. Troike; Raymond E. Smiley

[57] ABSTRACT

An electronically adjustable capacitor (varactor), an active element such as a Field Effect Transistor arranged to exhibit negative resistance, and an inductor are arranged as a frequency tunable resonator suitable for use at microwave frequencies. The negative resistance of the active element may be adjusted to compensate for the resistance of the other resonator components such that the resonator exhibits very high Q and therefore high selectivity and low loss. The resonator may be used as a filter element in a tunable filter. Alternatively the negative resistance of the active element may be adjusted such that the resonator exhibits net negative resistance and may be incorporated in a tunable reflection type amplifier.

14 Claims, 8 Drawing Figures

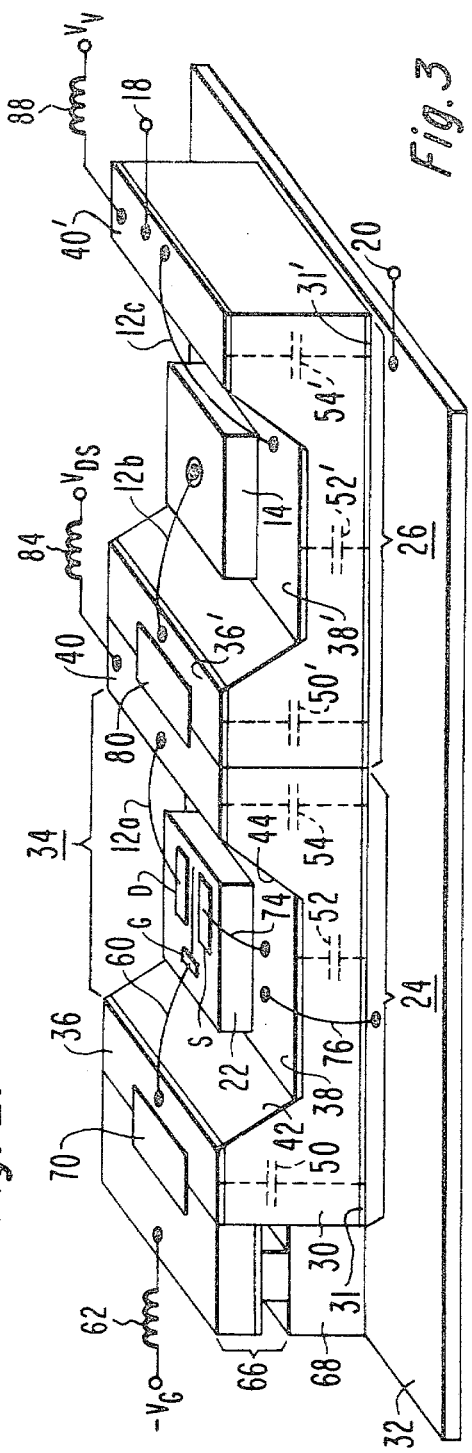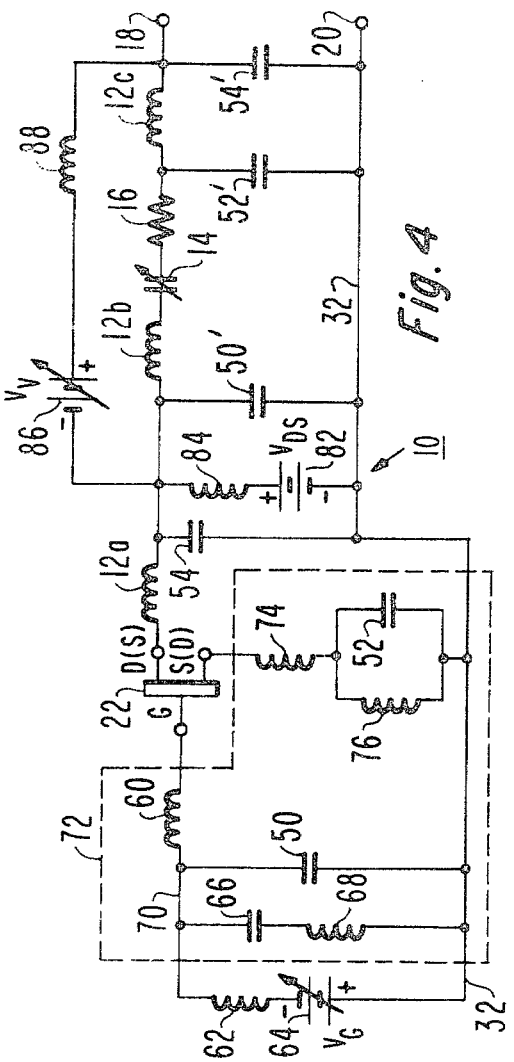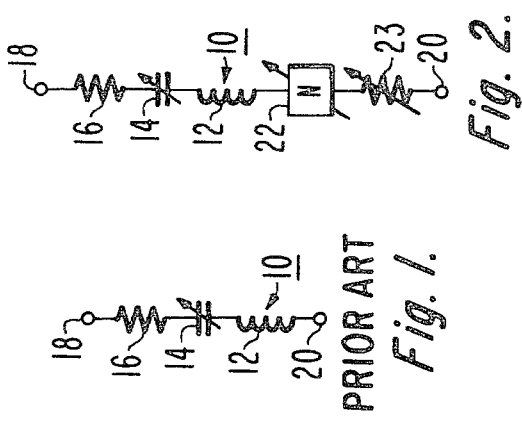

ELECTRONICALLY TUNABLE RESONATOR CIRCUIT

The U.S. government has rights in this invention pursuant to Contract No. N00173-77-C-0201 awarded by the Department of the Navy.

This case is a continuation-in-part of U.S. patent application Ser. No. 947,055 filed Sept. 29, 1978, now abandoned.

This invention relates to resonator circuits, and more particularly, to electronically tunable resonator circuits.

Resonator circuits (resonators) are components of filters, reflection type amplifiers, and oscillators. High Q tunable filters operational at microwave frequencies are vital components in various electronic countermeasure and electronic warfare systems. In many cases, these filters are desirably electronically tunable at high speeds over wide frequency ranges. In the prior art, Yittrium Iron Garnet (YIG) resonators, tunable over a wide band of frequencies, have been predominately used in microwave filter applications because of their inherent excellent selectivity and linearity characteristics over multi-octave frequency ranges. However, a filter comprised of a YIG resonator has severe restrictions with regard to slow tuning speed and suffers from other drawbacks such as large size relative to solid state components, hysteresis, temperature sensitivity and required bulky power supplies.

An alternate approach is the use of standard resonators which are capacitively loaded by a voltage tuned varactor diode. These diodes can provide octave bandwidth tuning ranges with reasonable linearity, offer very fast tuning speed (about 3 order of magnitude faster than YIGs) of the filter and permit the fabrication of filters small in size and weight compared to those using YIG resonators. At microwave frequencies, resonators utilizing varactors, which inherently have a large resistive component, however, undesirably exhibit relatively low Q. The large resistive component results in a greatly reduced achievable selectivity and also results in great loss of the signal in filter applications.

In accordance with a preferred embodiment of the invention an electronically frequency tunable resonator comprises a capacitance means having a capacitance, the value of which is electronically adjustable, an inductance means coupled in combination with the capacitance means and arranged to resonate at any of a range of frequencies determined by the value of the capacitance. The combination also exhibits a resistance. An active element characterized by a negative resistance is arranged with the combination to offset the resistance of the combination.

FIG. 1 is a schematic representation of a tunable resonator in its most basic form in accordance with the prior art;

FIG. 2 is a schematic representation of a tunable resonator in its most basic form in accordance with the invention;

FIG. 3 is a physical embodiment of a tunable resonator in accordance with the instant invention;

FIG. 4 is a schematic representation of the tunable resonator of FIG. 3 in accordance with the instant invention;

Figure 7:
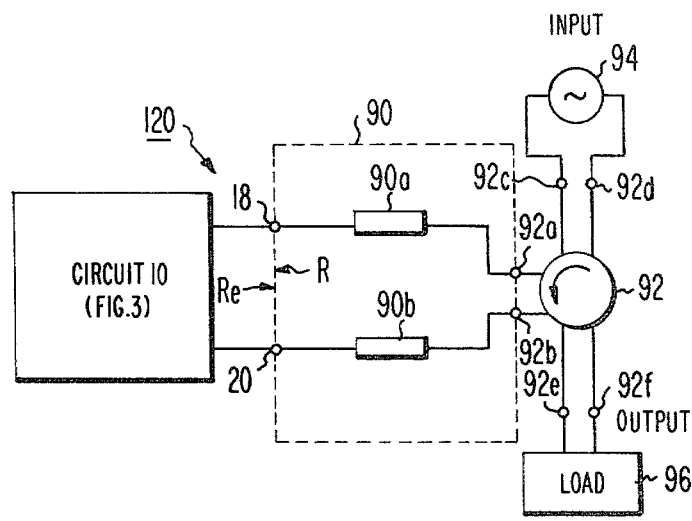
FIG. 7 is a reflection type amplifier utilizing a resonator in accordance with the invention.

FIG. 1 illustrates a prior art electronically tunable resonator circuit or resonator 10 in its most elemental form comprising an inductance means 12, a capacitance means 14, the value of which is electronically adjustable, and a resistance means 16, all series connected and coupled between terminals 18 and 20. At gigahertz frequencies inductance means 12 may be simply a short length of wire or transmission line. Capacitance means 14 is typically a varactor diode. Such a diode as known to those skilled in the art has a capacitance the value of which varies as a function of a d.c. voltage applied thereto. Resonators 10 are used in electronic circuitry such as filters, amplifiers and oscillators.

From elemental resonance theory, it will be remembered that at resonance:

$$2\pi f_0 L = 1/2\pi f_0 C \qquad (1)$$

from which:

$$f_0 = \frac{1}{2\pi \sqrt{LC}} \qquad (2)$$

Thus, if C (or L) is changed, $f_0$, the resonant frequency changes.

The impedance of circuit 10 between terminals 18 and 20 may be represented by the relation:

$$Z = R + j(2\pi f L - 1/2\pi f C) = R + jX \qquad (3)$$

so that at resonance, where the imaginary or reactive term is zero:

$$Z = R \qquad (4)$$

When the resonator of FIG. 1 is used as a filter element in a coupled resonator filter design to be hereinafter described, it is most desirable that R approach zero. Unfortunately, inductance 12, the various interconnecting wires and, more particularly, varactor diode 14 have resistance which is shown lumped as resistance element 16. Further, element 16 includes resistance due to interconnections of the various elements. The unloaded quality factor, $Q_0$, of the resonator such as that of FIG. 1, is measured by the formula:

$$Q_0 = (f_0/2R) \cdot (dX/df) \qquad (5)$$

where $f_0$ is defined by equation (2) and R and X are as defined in equation (3). It will be noted that as R decreases $Q_0$ desirably increases.

If the inductor is lossless, the resonator $Q_0$ is limited by the capacitive element only. For good selectivity it is desirable that the tunable resonator for a microwave filter have an unloaded $Q_0$ of about 1000. Unfortunately, since the Q of a varactor type capacitor varies inversely with frequency, and the resistance of existing varactors is relatively high, the circuit of FIG. 1 at microwave frequencies of interest exhibits a $Q_0$ of only about 40.

Turning now to FIG. 2, which retains the legend numbers of FIG. 1 for equivalent elements and which illustrates the invention in its most basic form, an active element 22 and a variable resistor 23, such as a PIN diode, are added to the series circuit of FIG. 1.

Active element 22 is of the type which exhibits negative resistance at frequencies of interest in the filter. Exemplary active elements are: field effect transistors (FETs), Tunnel diodes and IMPATT diodes. By proper choice and circuit arrangement, resistance 16 may be offset by the negative resistance of element 22, and the variable positive resistance of element 23 to obtain large Q. The requirement for element 22, in addition to exhibiting negative resistance, is that it be stable (not oscillate) at any frequency when inserted in useful circuitry other than an oscillator. Desirably, the amount of negative resistance of element 22 is adjustable, as in a FET, over the frequency range of interest, in which case element 23 is not necessary. Also, desirably element 22 should have low reactance relative to that of element 12 and 14.

Although the circuits of FIGS. 1 and 2 are in series relationship, it will of course be realized that the elements could be placed in parallel relationship to also comprise a filter element. A parallel circuit and the description thereof, will not be herein given since the relationship between series and parallel resonant circuits are well known to those skilled in the art. The textbook *Electrical Engineering Circuits* by H. H. Skilling, 1957, by John Wiley and Sons, Inc., at page 211, describes in detail the interrelationship between series and parallel resonant circuits.

Refer now to FIGS. 3 and 4, which illustrate respectively, a physical embodiment and schematic representation of an electronically tunable resonator in accordance with the present invention.

In FIG. 3, FET 22 and varactor 14 are mounted on respective identical carriers 24 and 26 abutted to each other. It will be realized that both elements could be mounted on a common carrier. Carrier 24 comprises a ceramic substrate 30 to which is bonded a metal layer 31. Metal layer 31 is secured to a metal base plate 32. Similarly, carrier 26 is secured to base plate 32. The substrate 30 is generally rectangular but has a central depressed region 34 in which is mounted FET 22. The surfaces, which are parallel to base plate 32 namely surfaces 36, 38 and 40 are metalized to render them electrically conductive. Angled surfaces 42 and 44 are not so metalized.

Parasitic capacitances exist between each of the metalized surfaces and base plate 32. These capacitances 50, 52 and 54, respectively (all shown in phantom) produce significant reactances at the microwave frequencies of interest in the filter. Reference numerals associated with carrier 26 are identical to equivalent reference numerals used in connection with carrier 24, except that they are primed to distinguish them.

A wire conductor 60 extends from FET 22 to surface 36. Similar wire conductors 12a, 12b, 12c, 74 and 76 which connect various components are also shown in FIG. 3. At microwave frequencies, these wires function as inductors. Thus, for each such wire illustrated in FIG. 3, its equivalent inductance is illustrated in FIG. 4 with corresponding identical reference numbers.

Referring now to the electrical schematic FIG. 4, where legends correspond to those in FIG. 3, the gate (G) terminal of FET 22 is coupled by a parasitic inductance 60 (composed of wire 60, FIG. 3) and radio frequency choke, (RFC) 62 to the negative side of a variable power supply 64, also legended $V_G$. The positive side of power supply 64, is connected to wire 32 corresponding to base plate 32, FIG. 3. As will be described more fully hereinafter, the value of the voltage provided by power supply 64 determines the amount of negative resistance exhibited by FET 22. Coupled in parallel with the series combination of RFC 62 and power supply 64, is the series combination of capacitor 66 and inductor 68. Capacitor 66 acts both as an RF bypass and a d.c. voltage blocking capacitor. Inductor 68 as illustrated in FIG. 3, is embodied as a block of metal attached between one terminal of capacitor 66 and base plate 32 for supporting capacitor 66 at the elevation of surface 36. The other terminal of capacitor 66 is coupled by a line 70 (a metal plate, FIG. 3), to carrier 24, and in particular to inductor 60 and parasitic capacitor 50. The source terminals (S) of FET 22 is coupled by a feedback path within dotted lines 72, FIG. 4, to the gate terminal (G) thereof.

The feedback path comprises a parasitic inductor 74 (wire 74, FIG. 3), feedback inductor 76 (wire 76, FIG. 3) in parallel with capacitor 52, parasitic inductor 68, capacitor 66 and inductor 60 in series. This feedback path provides regenerative feedback so that in operation FET 22 exhibits negative resistance between its source and drain terminals.

Although a source-gate feedback arrangement is illustrated in FIG. 4, it is also possible to obtain negative resistance with a drain-gate feedback arrangement. This arrangement is achieved by merely reversing the polarity of voltage source 82, the function of the terminals of FET 22 being thereby the source and drain as indicated by those electrodes shown within the parenthesis viz., (S), (D).

With certain values of capacitance of element 52 degenerative feedback is provided at frequencies above frequencies of interest for reasons which will be discussed below. The drain (D) terminal of FET 22 is coupled by inductors 12a and 12b (wires 12a and 12b, FIG. 3) to a varactor 14. Undesired parasitic capacitances 54 and 50' are coupled between the conductor 80 connecting inductors 12a and 12b and conductor 32. FET drain-source d.c. power supply 82 (also legended $V_{DS}$) and RFC 84 are series coupled between wire 80 and conductor 32 to provide d.c. drain-source power for FET 22.

Varactor 14 as previously mentioned, undesirably exhibits a rather large series resistance the value of which is included in resistor 16. Resistor 16 represents the equivalent combined resistance of all the resistances in the circuit following the output of the active element 22.

Resistor 16 is coupled to parasitic capacitance 52' and to inductor 12c (wire 12c, FIG. 3). Inductor 12c coupled to terminal 18 and parasitic capacitance 54' which is in turn coupled to wire 32 and terminal 20. A power supply 86 (also legended $V_V$) and RFC 88 are series coupled between conductor 80 and terminal 18 to provide power for the adjustment of varactor 14.

The resonator circuit of FIG. 4 operates as follows. The circuit resonates at one particular frequency in a range of frequencies dependent on the effective inductance of the circuit which is fixed, and on the effective capacitance of the circuit. The effective inductance of the circuit comprises the inductors 12a, 12b, 12c and other parasitic inductances that exist. The effective capacitance of the circuit comprises essentially the capacitance of varactor 14 and any other parasitic capacitance that exists. The value of capacitor 14 is dependent on the value of the adjustable power supply 86. Therefore, the frequency at which the circuit is resonant is adjustable by means of adjusting power supply 86. In contrast to the slow adjustment (on the order of milliseconds) of the aforementioned YIG resonator, adjustment of the present resonator over its entire frequency range may be accomplished in a few microseconds.

In the absence of FET 22 as previously mentioned, the $Q_0$ of the resonator would be very low. Such an undesirably low Q would be due to the rather high value of resistance 16 relative to the reactance of varactor 18. However, because FET 22 is present and arranged to exhibit a negative resistance due to regenerative feedback to the gate (G) provided by the circuit shown within dotted line 72, the value of the resistance of resistor 16 can be offset by a negative resistance such that the total circuit resistance is either positive or negative as described below. The value of negative resistance, given fixed values of feedback components in path 72, is regulated by FET 22 gate power supply 64.

Figure 5:
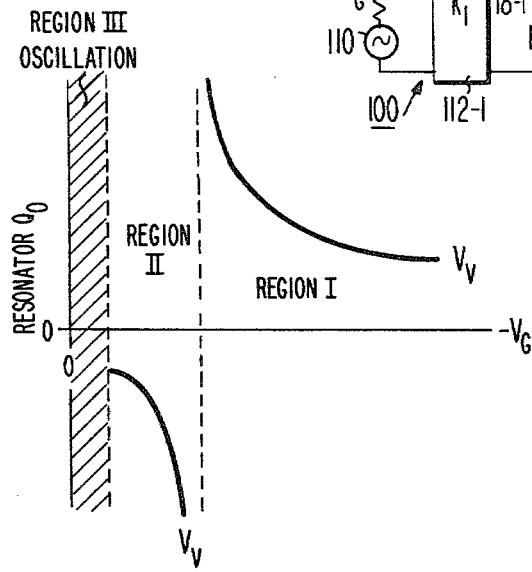
FIG. 5 is a waveform useful in understanding the operation of the resonator of FIG. 3.

FIG. 5 is a plot of Q for resonator 10 as a function of FET 22 gate voltage at resonance at a given value $V_V$ of varactor voltage corresponding to a given value of capacitance and a given frequency of resonance. It will be seen that the plot is divided into three regions. In Region I, corresponding to relatively large (negative) FET 22 gate voltages, circuit 10 is caused to exhibit, at resonance, a net positive resistance as measured between terminals 18 and 20. As the gate voltage is decreased, the negative resistance of FET 22 increases (becomes more negative) such that the total circuit resistance decreases toward zero. Consequently, circuit Q desirably increases toward infinity.

At some value of FET 22 gate voltage the total resistance at resonance of circuit 10 becomes zero and the circuit Q becomes infinity (See equation 5). To operate circuit 10 as a filter element, FET 22 gate voltage is adjusted in Region I, FIG. 5 at high values of Q. For gate voltage in Region II, circuit 10 exhibits between terminals 18 and 20 a negative resistance which increases as gate voltage decreases (in magnitude) toward zero. When operated in Region II, resonator circuit 10 with its negative resistance can be used in a reflection type amplifier. The effect of gate voltage on amplifier gain will be discussed hereinafter. As the gate voltage is further decreased as in Region III, the circuit may become unstable and oscillate which renders it undesirable for use as a filter or amplifier, but makes it useful as a tunable oscillator.

Figure 6:
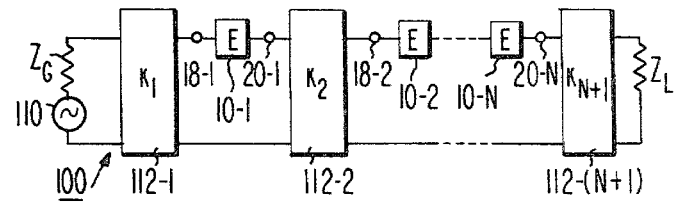
FIG. 6 is an N section filter utilizing one or more resonators in accordance with the invention.

FIG. 6 illustrates a plurality of resonators 10 used as elements in an N-section coupled resonator band pass filter 100 as described in chapter 11 of "Microwave Filters, Impedance-matching Networks, and Coupling Structures," G. L. Matthaei et al., McGraw Hill, 1964. A number of resonators 10 and inverters 112 are alternately interconnected in a prescribed manner so as to produce the desired filter response. The inverters are impedance transformers of conventional design that provide an image phase in odd multiples of ±90°. A frequency generator 110 of conventional design having internal resistance $Z_G$ is coupled via an inverter 112-1 at terminal 18-1 to a resonator 10-1 of the type illustrated in FIG. 3. Inverter 112-2 and element 10-1 are coupled at terminal 20-1. Inverter 112-2 is in turn coupled to a second element 10-2, as illustrated, or, for a one section filter to a load $Z_L$. In a similar manner other inverters and filter elements are interconnected. In particular, element 10-N is connected at terminal 20-N to inverter 112-(N+1) which is in turn connected to load $Z_L$.

Operation of the filter circuit 100 of FIG. 6 is as follows. Generator 110 produces either a fixed frequency within the range of frequencies to which each element 10 can be tuned or produces a range of frequencies, a small spectrum of which are to be passed to load $Z_L$.

The bandwidth of frequencies passed to $Z_L$ is determined by the setting of power supply 64 (FIG. 4) which determines the amount of negative resistance exhibited by FET 22 and therefore the Q of each filter element 10. The value of the center frequency (the frequency at which power transfer is maximum) passed by filter 100 is adjusted by adjustment of power supply 86 which adjusts the value of capacitor 14 and the frequency of resonance of filter element 10. In the case of the fixed frequency produced by generator 110 the setting of power supply 86 which causes that frequency to be passed to load $Z_L$ provides an indication of the frequency produced by generator 110 which frequency may be otherwise unknown.

FIG. 7, to which attention is now directed, illustrates a reflection type amplifier 120. The amplifier includes resonator circuit 10 of FIG. 3, a three port circulator such as a ferrite circulator 92 and an inverter means 90 coupled from circuit 100 at terminals 18, 20 to one port of the circulator at terminals 90a, 90b. The purpose of circulator 92 is to convert one port, two terminal, circuit 10 to a conventional two port, four terminal, amplifier. Circulator 92 may be coupled at terminals 92c, 92d to an input frequency source 94 and may be coupled at terminals 92e, 92f to a suitable load 96. Inverter means 90 may comprise a quarter wave length transmission line pair 90a, 90b to match the impedance of circuit 10 to that of circulator 92.

Operation of amplifier 120, of FIG. 7 is as follows. Input frequency source 94 may either produce a signal at a range of frequencies or a signal at a single frequency the value of which is to be determined within the range of frequencies to which circuit 100 may be tuned. Voltage supply 86 ($V_V$), (FIG. 4) which controls the value of capacitance of varactor 14 (FIG. 4) and thus the frequency at which circuit 10 resonates is set so that, in the case where source 94 produces a range of frequencies, circuit 10 resonates at a desired frequency of those produced by source 94, producing that frequency at load 96. In the case of a single frequency produced by source 94, $V_V$ is adjusted until a signal is received at load 96 which will be the frequency of source 94. FET 22 gate voltage ($V_G$) 64 is set to a value in Region II, FIG. 5, to provide desired gain and selectivity (Q) as described below.

At resonance the resistance of circuit 10 at terminals 18 and 20 with inverter 90 disconnected is defined as R. Because for an amplifier, circuit 10 is operated in Region II, FIG. 5, R will be a negative number. The resistance of inverter 90 and the following circuits at terminals 18 and 20 with circuit 10 disconnected is defined as $R_e$. The loaded Q, $Q_L$, of amplifier 120 is:

$$Q_L = (Q_0 \cdot R)/(R_e + R) \qquad (6)$$

where $Q_0$, the unloaded Q of circuit 10, is defined in equation (5). The gain, G, of amplifier 120 at resonance is defined as:

$$G = [(R_e + |R|)/(R_e - |R|)]^2 \qquad (7)$$

Thus, both the Q and gain depend on the resistance (at resonance) of circuit 10 which in turn depends on the setting of gate voltage 64 (FIG. 4).

Figure 8:
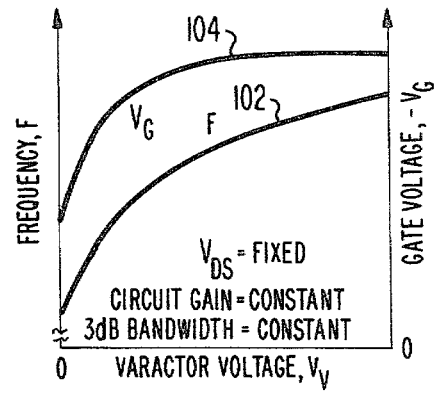
FIG. 8 is a set of waveforms useful in understanding the operation of the amplifier of FIG. 7.

FIG. 8 is a waveform 102 superimposed with a waveform 104. Waveform 102 is a plot of frequency passed by circuit 10 as a function of varactor voltage supply 86 (FIG. 4). It will be noted that, as the varactor voltage increases, the frequency at which circuit 10 resonates increases.

Waveform 104 is a plot of FET 22 gate voltage 64 required to maintain a given value of gain and bandwidth in circuit 10 as the varactor voltage is varied and therefore the frequency, at which circuit 10 is set to resonate, changes. It will be noted that as the varactor voltage increases and therefore as frequency increases, the gate voltage must increase to maintain a constant gain and bandwidth. For a desired gain greater than that illustrated in FIG. 8, a waveform (not illustrated) similar in shape to and below waveform 104 will be appropriate. Conversely, for a desired gain less than that illustrated in FIG. 8 a waveform (not illustrated) similar in shape to and above waveform 104 will be appropriate.

In a practical working embodiment of an amplifier it may be desired to utilize known circuitry for adjusting gate voltage $V_G$ as needed to maintain a preselected constant gain at circulator 92 output terminals 92e and 92f as the resonant frequency of circuit 10 is changed.

The following is a list of significant components and their values employed in one working embodiment of a resonator:

FET 22 = FET Chip by Plessey Model No. GAT 04/20
Varactor 14 = Varactor chip by GHz, Model No. 1500A
Alumina Carriers 24, 26 = 1.5 mm×0.8 mm×0.6 mm
Capacitor 66 = MOM Capacitor at 25 pf
Feedback inductor 76 = 0.8 nH
Capacitor 52 = 0.15–0.3 pF A one section filter 100 arranged as in FIG. 6 was constructed using one resonator 10 and two quarter wave inverters 112-1, 112-2, each with a characteristic impedance of 5Ω. The following performance values were measured:

$V_{DS}$ = 8 volts
$V_G$ = −2.4 volts
$V_V$ = 17.3 volts (typ.)
Midband frequency = 7.3 GHz
Midband loss = 0 dB
Bandwidth at 3 dB below midband = 36 MHz
Bandwidth at 20 dB below midband = 360 MHz
Tunable from 6.3 GHz to 7.7 GHz by adjustment of $V_V$ between 3.5–28 volts A two section filter 100 arranged as in FIG. 6 with two 5Ω quarter wave end inverters and a capacitive 0.25Ω center inverter (112-2) was constructed. The following performance values were measured:

$V_{DS}$ = 8 volts
$V_G$ = −4.23 volts
$V_V$ = 10 volts (typ.)
Midband frequency = 8.79 GHz
Midband loss = 1.5 dB
Bandwidth at 3 dB below midband = 120 MHz
Bandwidth at 18 dB below midband = 335 MHz
Tunable from 8.5 GHz to 9.0 GHz by adjustment of $V_V$ between 5–30 volts A working embodiment of a reflection type amplifier arranged as in FIG. 7 and tuned for operation near 9 GHz gave the following performance values:

$V_{DS}$ = 8 volts
$V_G$ = −1.5 volts
$V_V$ = 15 volts (typ.)
Midband frequency = 9.0 GHz
Midband gain — 14 dB
Bandwidth at 3 dB below midband = 10 MHz
Tunable from 8.6 GHz 9.15 GHz by adjustment of $V_V$ between 0–25 volts The gate voltage of FET 22 necessary to maintain a gain of 14 dB over the frequency band (8.6–9.15 GHz) ranged from −1.13 volts to −1.52 volts.

As mentioned previously, where, in contrast to an FET, a type of negative resistance device not having an adjustable value negative resistance, such as a Tunnel diode or IMPATT diode, is used to provide negative resistance, a conventional positive resistance device (23, FIG. 2) may be adjusted to give the proper amount of negative resistance such that circuit 10 may be adjusted to operate in Region I, Region II or Region III (FIG. 5) as desired.

It should now be appreciated that in accordance with the present invention, an electronically frequency tunable stable resonator is provided for reducing if not eliminating the resistance exhibited by the various components. While the embodiment of the present invention described in conjunction with FIGS. 3 and 4 supresses undesired parasitic oscillations of the feedback circuit 72 by the provision of capacitor 52, it should be understood that the invention is useful for application in different frequency ranges and different structural configurations.

Accordingly, it should be understood that the invention is applicable to resonator configurations utilizing active devices functioning to provide negative resistance in the desired range of operating frequencies. Thus, in the practice of the invention parasitic oscillations must be supressed in order to assure stable operation of such devices in the desired frequency range.

What is claimed is:

1. An electronically frequency tunable resonant circuit, comprising in combination:
   a capacitance means, the value of which is electronically adjustable;
   an inductance means coupled in combination with said capacitance means arranged to resonate at a selected one of a range of frequencies dependent on the value of said capacitance;
   said combination also including resistance means;
   a field effect transistor (FET) characterized by a negative resistance, arranged with said combination to offset the resistance of said resistance means, said FET including a source terminal, a drain terminal, and a gate terminal; and
   means for providing a feedback path for said FET to produce negative resistance between said source and drain terminals.

2. The combination as set forth in claim 1, wherein said capacitance means is a varactor diode.

3. The combination as set forth in claim 1, wherein said capacitance means is a varactor diode, said diode having resistance, said resistance means further including said diode resistance.

4. The combination as set forth in claim 1, wherein said capacitance means, said inductance means and active element are arranged in a series circuit.

5. The combination as set forth in claim 1, wherein said means producing said feedback path comprises means providing said feedback path between said drain and gate terminals.

6. The combination as set forth in claim 1, wherein said means producing said feedback path comprises means providing said feedback path between said source and gate terminals.

7. The combination as set forth in any of claims 1, 5 or 6, wherein said inductance means, said capacitance means, and a drain-source path of said FET are in a series connection.

8. The combination as set forth in any of claims 1, 5 or 6, wherein said feedback means comprises a second means producing an inductance.

9. The combination as set forth in claim 7, wherein said FET is subject to oscillation at frequencies outside said range of frequencies and further including means for producing degenerate feedback outside said range of frequencies, said degenerate feedback means being coupled across said means producing said feedback path and arranged to eliminate said oscillations.

10. The combination as set forth in claim 9, wherein said means producing said degenerate feedback comprises second means producing a capacitance.

11. The combination as set forth in claim 10, wherein said FET is mounted on a carrier, said carrier comprising an insulated substrate having metal layers on opposed surfaces thereof, said substrate and metal layers being said second means producing said capacitance.

12. A reflection type frequency tunable amplifier for amplifying frequencies at a selected frequency comprising in combination:
   capacitance means, the value of which is electronically adjustable, said capacitance means having resistance R;
   inductive means coupled in combination with said capacitance means arranged to resonate therewith at said selected frequency, which is selected dependent on the value of said capacitance means;
   an active element in combination with said capacitance means and inductance means, said active element exhibiting a negative resistance greater in magnitude than R, said combination exhibiting negative resistance;
   three port circulator means; and
   impedance matching means coupled between said combination and one port of said circulator for matching the impedance of said combination to the impedance of said circulator, the other two ports thereof being an input port and output port respectively where a signal applied at said input port at said selected frequency is amplified by said combination and appears at said output port.

13. An electronically frequency tunable filter for associated electronic apparatus, comprising in combination:
   inverter means having first and second ports;
   a capacitance means, the value of which is electronically adjustable;
   an inductance means;
   means connecting said inductance means and said capacitance means in series connection across the first port of said inverter for resonating at a selected one of a range of frequencies dependent on the value of said capacitance to provide relatively low impedance at said selected frequency, said series connection also including positive resistance;
   an active element characterized by a negative resistance, arranged together with said series connection to offset said positive resistance; and
   adjusting means for adjusting the negative resistance of said active element to a desired value;
   means for connecting the second port of said inverter means to said associated electronic apparatus.

14. An electronically frequency tunable reflection amplifier, comprising in combination:
   a capacitance means, the value of which is electronically adjustable;
   an inductance means coupled in combination with said capacitance means arranged to resonate at a selected one of a range of frequencies dependent on the value of said capacitance, said combination also including resistance means;
   an active element characterized by a negative resistance, arranged with said combination to offset the resistance of said resistance means; and
   a three port microwave circulator means and inverter means coupling said combination and active element to one of said three ports to form a tunable reflection amplifier for selectively amplifying said selected frequency.

* * * * *